(12) United States Patent
Heavlin (10) Patent No.: US 6,708,073 B1
(45) Date of Patent: Mar. 16, 2004

(54) LOT SPECIFIC PROCESS DESIGN METHODOLOGY

(75) Inventor: William D. Heavlin, El Granada, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 725 days.

(21) Appl. No.: 09/637,100

(22) Filed: Aug. 10, 2000

(51) Int. Cl.[7] ............................................. G06F 19/00
(52) U.S. Cl. ....................................... 700/121; 700/31
(58) Field of Search ................................. 700/121, 103, 700/109, 31, 117, 29; 716/4

(56) References Cited

U.S. PATENT DOCUMENTS

| | | | | |
|---|---|---|---|---|
| 5,301,118 A | * | 4/1994 | Heck et al. .................. | 700/109 |
| 5,319,564 A | * | 6/1994 | Smayling et al. .............. | 703/13 |
| 5,418,974 A | * | 5/1995 | Craft et al. ..................... | 716/2 |
| 5,526,293 A | * | 6/1996 | Mozumder et al. ........... | 716/19 |
| 5,646,870 A | | 7/1997 | Krivokapic ..................... | 716/4 |
| 5,655,110 A | | 8/1997 | Krivokapic ................... | 716/19 |
| 5,719,796 A | * | 2/1998 | Chen ............................ | 703/13 |
| 5,787,269 A | * | 7/1998 | Hyodo ......................... | 703/13 |
| 6,366,822 B1 | * | 4/2002 | Heavlin ........................ | 700/31 |

OTHER PUBLICATIONS

S. Kaplan and L. Karklin, "Calibration of Lithography Simulator by Using Substitute Patterns," Proceedings on Optical/Laser Microlithography VI, SPIE 1927, pp. 847–858, 1993.

C. Mack and E. Charrier, "Yield Modeling for Photolithography," Proceedings of OCG Microloithography Seminar, pp. 171–182, 1994.

TMA Depict, Two–Dimensional Process Simulation Program for Deposition, Etching, and Photolithography, vol. 1, Version 3.0, Technology Modeling Associates, Inc., Palo Alto, California, 1993.

Mandel, J., "The Statistical Analysis of Experimental Data," Chapter 12, Wiley, New York, 1964.

Z. Krivokapic and W.D. Heavlin, "Predicting Manufacturing Variabilities for Deep Micron Technologies: Integration of Process, Device, and Statistical Simulations," in Simulation of Semiconductor Devices and Processes, 5, S. Selberherr, H. Stippel and E. Strasser, (eds), pp. 229–232, SpringerVerlag, New York, 1993.

W.D. Heavlin and G. P. Finnegan, "Dual Space Algorithms for Designing Space–Filling Experiments," Interface 1994, Research Triangle North Carolina, Jun. 1994.

B.D. Ripley, "Spatial Statistics," pp. 44–75, Wiley, New York, 1981.

A.B. Owen, "Controlling Correlations in Latin Hypercube Samples," Journal of the American Statistical Association, vol. 89, No. 428, pp. 1517–1522, Dec. 1994.

(List continued on next page.)

Primary Examiner—Leo Picard
Assistant Examiner—Chad Rapp
(74) Attorney, Agent, or Firm—Fliesler Meyer LLP (57) ABSTRACT

A method of defining a toleranced process based on a nominal process, applicable to any manufacturing process wherein the output is dependent on a process having a number of input factors which are subject to variation, and have a mean and standard deviation. The method comprises the steps of: representing the variability of the response of a system to the actual distribution of at least one of said factors and parameterized by at least one parameter; performing at least one step in the manufacturing process for a given lot of wafers; evaluating actual variability and nominal variability of said components against a schedule of parameters in an array; modeling the output of the evaluation to determine the manner in which to continue processing of the lot.

32 Claims, 6 Drawing Sheets

OTHER PUBLICATIONS

W. D. Heavlin, "Variance Components and Computer Experiments," 1994 ASA Proceedings, Section on Physical and Engineering Sceinces, Toronto, Aug. 1994.

A. R. Neureuther and F. H. Dill, "Photoresist Modeling and Device Fabrication Applications," Optical and Acoustical Microelectronics, pp. 233–249, Polytechnic Press, New York, 1974.

F. H. Dill, J.A. Tuttle, A.R. Neureuther, "Modelling Positive Photoresist," Proceedings, Kodak Microelectronics Seminar, pp. 24–31, 1974.

C. Mac, "Development of Positive Photoresist," Journal of the Electrochemical Society, vol. 134, Jan. 1987.

M. Stein, "Large Sample Properties of Simulations Using Latin Hypercube Sampling," Technometrics, vol. 29, No. 2, pp. 143–151, May 1987.

M. D. McKay, L.M. Moore, and R. J. Beckman, "Using Variance to Identify Important Inputs," Spring Research Conference on Statistics in Industry and Technology, chapel Hill, NC, Jun. 12–15, 1994.

William D. Heavlin and Luigi Capodieci, "Calibration and Computer Experiments," 1997 American Statistical Association Proceedings, Section on Physical and Engineering Sciences, Anaheim, Aug. 1997 (scheduled for publication Summer 1998), pp. 58–63.

Heavlin, W.D., Statically Based Process Windows, 1998 American Statistical Association Proceedings, Section on Physical and Engineering Sciences, pp. 216–221.

Taguchi, Genichi, "Introduction To Quality Engineering Designing Quality Into Products and Processes," Asian Productivity Organization, Tokyo, 1986, pp. 74–79.

* cited by examiner

ASML_NARROW  7R x 3C

| 0 | 1 mean | 2 stdev | 3 effort |
|---|--------|---------|----------|
| 1 E | 11.00 | 0.183333 | 0.9 |
| 2 F | -0.20 | 0.166667 | 0.9 |
| 3 M | 0.22 | 0.002200 | 0.9 |
| 4 R | 0.78 | 0.001667 | 0.9 |
| 5 B | 110.00 | 1.666667 | 0.9 |
| 6 P | 90.00 | 0.166667 | 0.9 |
| 7 D | 66.00 | 0.366667 | 0.9 |

40 —

INPUT

FIG. 3A

R_ANNCD_CENTER  210R x 4C
r_anncd_center

| 0 try | 1 FACTORS | 2 factor | 3 STDEV | 4 MEAN |
|-------|-----------|----------|---------|--------|
| 1 | | E | 0.015798 | 0.213972 |
| 2 | | F | 0.016224 | 0.213999 |
| 3 | | M | 0.016390 | 0.214033 |
| 4 | | R | 0.016441 | 0.214119 |
| 5 | | B | 0.016407 | 0.214104 |
| 6 | | P | 0.015785 | 0.214042 |
| 7 | | D | 0.016392 | 0.214051 |
| 8 | | E | 0.015118 | 0.213901 |
| 9 | | F | 0.015563 | 0.213929 |
| 10 | | M | 0.015735 | 0.213961 |
| 11 | | R | 0.015792 | 0.214047 |
| 12 | | B | 0.015752 | 0.214033 |
| 13 | | P | 0.015237 | 0.213984 |
| 14 | | D | 0.015738 | 0.213980 |
| ... | | | | |
| 204 | PEPEPEPEPFEPFEPFEP | E | 0.006967 | 0.212542 |
| 205 | PEPEPEPEPFEPFEPFEP | F | 0.006960 | 0.212523 |
| 206 | PEPEPEPEPFEPFEPFEP | M | 0.006989 | 0.212470 |
| 207 | PEPEPEPEPFEPFEPFEP | R | 0.007093 | 0.212562 |
| 208 | PEPEPEPEPFEPFEPFEP | B | 0.007005 | 0.212554 |
| 209 | PEPEPEPEPFEPFEPFEP | P | 0.006972 | 0.212554 |
| 210 | PEPEPEPEPFEPFEPFEP | D | 0.006994 | 0.212491 | type "r_anncd_center" [205,1]
  PEPEPEPEPFEPFEPFEPFEP & F

E ||||  ||||  I
F ||||  ||
P ||||  ||||  |||

50 —

OUTPUT

FIG. 3B

Interactive SPW Dialog:

| COL. | | ExpD | Focus | MaskCD | prThk | BARC | PEB | dev time | RESULTING CONTROL |
|---|---|---|---|---|---|---|---|---|---|
| 1 | reSpec | 0.31381 | 0.47830 | 1.00000 | 1.00000 | 1.00000 | 0.28243 | 1.00000 | 0.103544 |
| 2 | relax F | 0.31381 | 0.81000 | 0.90000 | 0.90000 | 0.90000 | 0.28243 | 0.90000 | 0.111536 |
| 3 | tighten all | 0.25000 | 0.81000 | 0.81000 | 0.81000 | 0.81000 | 0.25000 | 0.81000 | 0.103152 |
| 4 | relax F | 0.25000 | 0.90000 | 0.81000 | 0.81000 | 0.81000 | 0.25000 | 0.81000 | 0.105728 |
| 5 | tighten F | 0.25000 | 0.85000 | 0.81000 | 0.81000 | 0.81000 | 0.25000 | 0.81000 | 0.104289 |
| 6 | relax F | 0.25419 | 1.00000 | 0.81000 | 0.81000 | 0.81000 | 0.25419 | 0.81000 | 0.109273 |
| 7 | tighten all | 0.25419 | 1.00000 | 0.72900 | 0.72900 | 0.72900 | 0.25419 | 0.72900 | 0.107819 |
| 8 | tighten all | 0.25419 | 1.00000 | 0.65610 | 0.65610 | 0.65610 | 0.25419 | 0.65610 | 0.106526 |
| 9 | tighten all | 0.25419 | 1.00000 | 0.59049 | 0.59049 | 0.59049 | 0.25419 | 0.59049 | 0.105365 |
| 10 | tighten all | 0.25419 | 1.00000 | 0.53144 | 0.53144 | 0.53144 | 0.25419 | 0.53144 | 0.104352 |
| 11 | tighten all | 0.25419 | 1.00000 | 0.47830 | 0.47830 | 0.47830 | 0.25419 | 0.47830 | 0.103438 | reSpec values:

```
                    L49   50R x 6C
                    0    1 dF      2 dE      3 dPR     4 dB      5 dPEB    6 dD
                    ---------------------------------------------------------------
                    1    0.000000  0.166667  0.166667  0.666667  0.333333  0.333333
                    2    0.000000  0.666667  0.000000  0.000000  0.833333  0.000000
                    3    0.000000  0.833333  0.833333  1.000000  1.000000  0.666667
                    4    0.000000  0.500000  0.666667  0.166667  0.500000  0.833333
                    5    0.000000  1.000000  0.333333  0.500000  0.000000  0.500000
                    6    0.000000  0.333333  0.500000  0.333333  0.166667  0.166667
```

90 — # #pwindow1("pw_dc5cd","L49","pw_mst","LHS343","cd_dc5a")

```
                              LHS343   343R x 8C
                              0        1 A      2 B      3 C      4 D      5 E      6 F ...
                              -------------------------------------------------------------
                              1   1    0.005   -0.005   -0.773    0.291   -0.165   -0.019
                              2   2    0.992    0.012   -0.992   -0.390   -0.059   -0.091
              PW_MST  6R x 2C  314       -0.184   -0.117    0.488    0.130    0.173
                                154        0.173    0.066    0.199   -0.015   -0.519
              0 factor  1 mean  2 stdev  241  0.170   -0.015    0.069   -0.086   -0.202
              -----------------------   220  0.329   -0.358   -0.148   -0.133   -0.135
              1 focus      -0.20   0.600 306 -0.140   -0.213   -0.624    0.190   -0.094
              2 expDose    11.19   1.119 692  0.049    0.376    0.007   -0.511    0.390
              3 PRThk       0.75   0.020 198 -0.211    0.536    0.012    0.238    0.056
              4 BARC      120.00  20.000 235  0.017   -0.089    0.022    0.007   -0.814
              5 PEB        90.00   1.000 274 -0.310   -0.002   -0.715    0.610   -0.655
              6 DevT       64.00   1.000 545  0.481   -0.140   -0.024   -0.455    0.049
```

One or More
Actual
mean, stdev

92 — # dis pw_dc5cd

```
        PW_DC5CD   49R x 1C 0 mean       1 stdev       0 mean       1 stdev       0 mean       1 stdev
        --------------------       --------------------       --------------------
        1  0.199502  0.016406      13  0.210445  0.042132     25  0.198141  0.024265
        2  0.202471  0.038783      14  0.212782  0.043284     26  0.205188  0.045237
        3  0.200763  0.048054      15  0.204532  0.030229     27  0.200663  0.019051
        4  0.200327  0.026851      16  0.206870  0.032515     28  0.199285  0.031152
        5  0.204120  0.039771      17  0.208242  0.048108     29  0.201464  0.010944
```

94 — # col 2 of pw_dc5cd=log(col 1)
96 — # #krigeest( )
Name of Kriging model> kpw_dc5cd
Tableportion of response values> col 1 of pw_dc5cd
Tableportion of design points> col 1 to 6 of L49
Tableportion of 1st derivative grid> col 1 to 6 of L8
Number of iterations> [4] 2
Ridge parameter> [0] 0.01
SVD tolerance> [5e-17] 1e-12
0.000813
 . . .
0.00007
98 — # type exp(#kriger("kpw_dc5cd",1,1,1,1,1,1) )
0.060705
 *vs 0.060533*

FIG. 6

LOT SPECIFIC PROCESS DESIGN METHODOLOGY

BACKGROUND OF THE INVENTION

1. Field of the Invention

The invention is directed to the mass production of semiconductor devices. The invention is more particularly directed to the problem of processing lots of wafers sharing one or more common defects and to resolving those defects.

2. Cross Reference to Related Publications

The following publications are cited here for purposes of reference:

(1) S. Kaplan and L. Karklin, "Calibration of Lithography Simulator by Using Substitute Patterns," *Proceedings on Optical/Laser Microlithography* VI, SPIE 1927, pp. 847–858, 1993.

(2) C. Mack and E. Charrier, "Yield Modeling for Photolithography," *Proceedings of OCG Microlithography Seminar*, pp. 171–182, 1994.

(3) TMA DEPICT, *Two-Dimensional Process Simulation Program for Deposition, Etching, and Photolithography*, version 3.0, Technology Modeling Associates, Inc., Palo Alto, Calif., 1993.

(4) Mandel, J, *The Statistical Analysis of Experimental Data*, Chapter 12, Wiley, N.Y., 1964.

(5) Z. Krivokapic and W. D. Heavlin, "Predicting Manufacturing Variabilities for Deep Micron Technologies: Integration of Process, Device, and Statistical Simulations," in *Simulation of Semiconductor Devices and Processes*, 5, S Selberherr, H Stippel and E Strasser, eds, pp. 229–232, Springer-Verlag, N.Y., 1993.

(6) W. D. Heavlin and G. P. Finnegan, "Dual Space Algorithms for Designing Space-filling Experiments," *Interface* 1994, Research Triangle, North Carolina, June 1994.

(7) B. D. Ripley, *Spatial Statistics*, pp. 44–75, Wiley, N.Y., 1981.

(8) A. B. Owen, "Controlling Correlations in Latin Hypercube Samples," *Journal of the American Statistical Association*, Vol. 89, No. 428, pp.1517–1522, December 1994.

(9) W. D. Heavlin, "Variance Components and Computer Experiments," 1994 *ASA Proceedings, Section on Physical and Engineering Sciences*, Toronto, August 1994.

(10) A. R. Neureuther and F. H. Dill, "Photoresist Modeling and Device Fabrication Applications," *Optical and Acoustical Microelectronics*, pp. 223–247, Polytechnic Press, New York, 1974.

(11) F. H. Dill, J. A. Tuttle, A. R. Neureuther, "Modeling Positive Photoresist," *Proceedings, Kodak Microelectronics Seminar*, pp. 24–31, 1974.

(12) C. Mac, "Development of Positive Photoresists," *Journal of the Electrochemical Society*, Vol. 134, January 1987.

(13) M. Stein, "Large Sample Properties of Simulations using Latin Hypercube Sampling," *Technometrics*, Vol. 29, No. 2, pp. 143–151, May 1987.

(14) M. D. McKay and R. J. Beckman, "Using Variance to Identify Important Inputs," 1994 *ASA Proceedings, Section on Physical and Engineering Sciences*, Toronto, August 1994.

(15) William D. Heavlin and Luigi Capodieci, "Calibration and Computer Experiments," 1997 *American Statistical Association Proceedings, Section on Physical and Engineering Sciences*, Anaheim, August 1997 (scheduled for publication Summer 1998), pp. 58–63.

(16) Heavlin, W. D., "Statistically Based Process Windows, 1998 *American Statistical Association Proceedings, Section on Physical and Engineering Sciences*, pp. 216–221.

(17) Krivokapic, Z., Heavlin, W. D., and Kyser, D., U.S. Pat. No. 5,646,870 issued Jul. 8, 1997, entitled "Method for Setting and Adjusting Process Parameters to Maintain Acceptable Critical Dimensions Across Each Die of Mass-Produced Semiconductor Wafers."

(18) Krivokapic, Z., Heavlin, W. D., and Kyser, D., U.S. Pat. No. 5,655,110 issued Aug. 5, 1997, entitled "Method For Setting And Adjusting Process Parameters to Maintain Acceptable Critical Dimensions Across Each Die of Mass-produced Semiconductor Wafers."

Each of the aforementioned publications is hereby incorporated by reference.

3. Description of the Related Art

Modern, high-density, integrated circuit (IC) devices are typically mass-produced with large numbers of critically-dimensioned features. In manufacturing, it is desirable to maintain the respective critical dimensions of each die within a plurality of mass-produced IC wafers constrained to certain respective values in order to assure desired operating speeds and operational characteristics of the produced IC.

Each feature on each IC die in a mass-produced wafer is the product of a succession of many process steps. Each process step is controlled by a combination of variable process parameters.

Different combinations of variations in process parameter can occur on a random basis across the numerous process steps of a mass-production line, on a die-by-die basis. This introduces noise into the uniformity of the product outflow of the production line. Sometimes a specific combination of process parameter deviations is relatively innocuous, sometimes it is not. It all depends on which process parameters are deviated for a given IC die and how their respective process steps interrelate to establish critical dimensions on that given die.

One example of such multiple, interrelated process steps that may be useful in understanding the interaction of factors in the present application, are those typically employed to define a pattern of conductive lines deposited across an insulator of an IC chip.

First, a dielectric layer of a generally non-planar form is created across the wafer. Such a non-planar dielectric layer may constitute the combined gate oxide and field oxide of a CMOS device. The non-planarity of the dielectric layer may alternatively be attributed to the non-planarity of underlying trenches, steps, mesas or other topographic features of the chip.

Next, a polysilicon or other conductive layer is deposited conformably on top of the dielectric layer. An anti-reflective coating (ARC) may be optionally deposited on the conductive layer to reduce undesired reflections in a following exposure step.

The deposition of the conductive layer and optional ARC layer is followed by a spinning-on or other deposition of a photoresist (PR) layer. The PR layer may or may not be planarized depending on process specifics.

The photoresist-coated wafer is then positioned within a stepper by an alignment mechanism. Tiled areas of the photoresist (PR) are successively exposed to a stepped pattern of resist-modifying radiation. After the step-wise exposure, the photoresist is "developed" by, for example, soft baking the wafer to induce cross-polymerization in the photoresist material and by subsequently dissolving away non-hardened portions of the photoresist with a specific solvent. The developed photoresist defines an etch mask.

The developed wafer is next etched, for example in a plasma etch chamber, so as to transfer the hardened image in the photoresist to the conductive layer. This produces a corresponding pattern of lines in the conductive (e.g., doped polysilicon) layer.

The photoresist mask is stripped off, or kept depending on process specifics, and further process steps follow. One example of a further process step is the selective implant of dopants into exposed semiconductor regions so as to create self-aligned source and drain regions at opposite sides of each conductive line, where the conductive line lies over gate oxide. The width of the conductive line at such a region of dopant implant defines the channel length of the formed IGFET transistor.

Within each of the above-described process steps, there are one or more variable physical attributes (or "process parameters") that control the final outcome of the produced device. Some process parameters may be adjusted by a line operator. Some are "set" by the design of the process equipment that is installed into the mass-production line.

Post-exposure development time and temperature are also subject to variance away from pre-established goal values. The diffusion length of the development chemistry may vary across a wafer. In a subsequent plasma etch, the variables can include: time, pressure, temperature, flow rate, and field-proximity effects resulting from the pitch and step profile of closely-spaced mask features.

Because successive steps of IC production tend to be interdependent, a slight variation in parameter(s) of one process step can be magnified by a further variation in the parameters of a second process step to produce unacceptable numbers of defective product at the output end of the mass-production line.

For example, if PR (photoresist) thicknesses decrease slightly and the focal depth of the exposure optics also decreases slightly and the exposure dosage also decreases slightly during production of a first-sampled IC chip as compared to the corresponding process parameters for a second-sampled IC chip, the combined effect may be to significantly shift the position and intensity of the radiation exposure pattern relative to the photoresist layer during the production of the first-sampled IC chip. The second-sampled IC chip may come off the production line in acceptable form while the first-sampled chip comes out of the same mass-production line in defective form.

It is hard to pinpoint why mass-production yield for a given circuit layout on a given mass-production line becomes unacceptably low. The statistical variance of PR thickness across the production lot may be small. The statistical variance of focus across the production lot may be small. But the physical interaction between the two noise quantities can be such that the overall lithography process produces chips having a much larger variance in terms of critical dimensions. If the overall variance in final critical dimensions becomes too large, production yield may suffer significantly.

The interdependence of variance of a number of specific process steps is not easily perceived. Hence, computer experimentation has aided the engineer by allowing distributions of key output parameters to be estimated. Generally, this is accomplished by varying selected inputs or noise factors, then by running computer code to simulate the variation likely to occur in manufacturing.

Different process analysis and design approaches exist with respect to the description, modeling and modification of a given process based upon the variation likely to occur in the process. The first approach, generally referred to as *system design* (as defined by Genichi Taguchi in "Introduction to Quality Control," p.75 (Asian Productivity Organization, 1986)), comprises the general product architecture, schematic, functionality, and feature set. In the second approach, generally referred to as *parameter design*, as defined by Taguchi, id. at p. 76, nominal process settings are determined in order to minimize performance variability and costs. In a third approach, referred to as *tolerance design* (Taguchi, id. at p. 78), tolerance and specification limits are determined in order to achieve engineering objectives and minimize costs. The invention described herein is in the tolerance design area.

Computer experiments have emerged as one way engineers can model process designs using statistical methods to devise process parameters for semiconductor manufacturing. The models allow engineers to increase product yields by selecting variances in certain process factors such that the variance(s) of the output characteristic(s) does(do) not adversely affect product performance.

One modeling paradigm involves a description of the effect of a change in one process variation on the output of another relative to some common reference. For the purposes of this description, this paradigm will be defined as an "engineering process window." In one aspect, a process window is the inherent effect of a change in one parameter resulting in an effect on any other parameter which may be plotted in two (or perhaps more) dimensions. Stated still another way, in the case of two input parameters, a process window is any description of the tradeoff between the tolerance of one input parameter and the tolerance of other input parameters. Parameter design gives a process window which defines, as a function of input parameters $X_1 \ldots X_p$, the region in which the product performs in conformance to specifications. Tolerance design yields, for a given range of input parameters, the tolerances $X_1 \pm \Delta_1, \ldots, X_f \pm \Delta_f$ which allow the product to perform in conformance to its performance specification.

In computer experimentation involving engineering process windows, calibration to realistic measurements is generally compared with computer-implemented models. Data from the process may be sampled from sacrificial areas of actual processed substrates, with the sample data then used with empirical experiments or computer simulators (such as, for example, the DEPICT photolithography simulator available from Technology Modeling Associates of Palo Alto, Calif.) to provide a calibrated model of the process results.

Process windows which compare results of altering two factors are relatively simple: the model deals with changes to one parameter which affect another parameter. The analysis becomes much more complex where a number of input factors are involved as in, for example, a cross-correlation of device parameters which are utilized in a semiconductor fabrication process and affect conductive line formation. Such factors include, and are abbreviated in this specification as follows:

| ABBREVIATION | FACTOR |
|---|---|
| annCD | annular exposure lighting diameter Critical Dimension (μm) (where annular exposure sources are used) |
| conv CD | conventional exposure lighting Critical Dimension (μm) (where conventional, shaped exposure sources are used) |
| ExpD | Exposure Dose (mJ/cm²μm) |
| Focus | Focus (μm) |
| mask CD | mask Critical Dimension (μm) |
| prThk | Photoresist Thickness (μm) |
| BARC | Base Anti Reflective Coating Thickness (μm) |
| PEB | Post Exposure Bake (minutes) |
| devT | Development Time (minutes) |

One descriptive method used successfully to compute variance parameters is known as analysis of manufacturing variance (AMV) and is set forth in Heavlin, "Variance Components and Computer Experiments," reference paper no. 9, cited above.

In analysis of manufacturing variance, the goal is to decompose the total variance of a process into components, one component associated with each input factor, and consistent with the variation to be anticipated in manufacturing. In a basic form of AMV, each noise factor is perfectly controlled, and the reduction in output variation noted. AMV allows for control of subsets of factors as well.

Figure 3A:
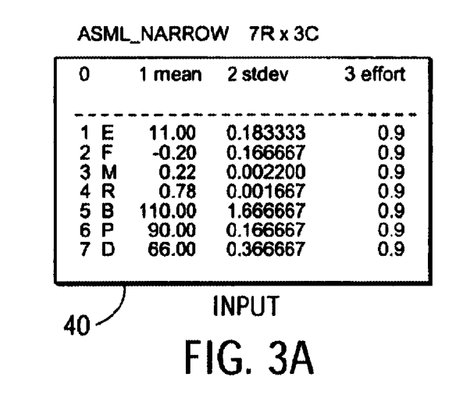
FIGS. 3A and 3B illustrate the input and output, respectively, of an incremental averaging algorithm process over 210 intervals.

AMV in its simplest form comprises using Latin hypercube (LHC) sampling for factors $X_1 \ldots X_f$ in a computer simulation, calculating the total variance of the resulting values, and substituting the mean of each factor to calculate the reduction in variance from the total variance to estimate the contributions of the factors held constant. AMV analysis is illustrated in the table shown in FIG. 3A. In FIG. 3A, each $\lambda$ represents a noise factor for an input under determination where $\lambda=0$, perfect control (no variance) of the input factor is presumed. One factor per iteration is presumed perfect, and all other factors are allowed to vary.

Another methodology related to AMV is described in U.S. Pat. No 5,646,870 and referred to therein as incremental leveraging. Initially, a predefined goal for variation is selected—for example 10%—and an evaluation of each factor made on this basis. Process parameters are selected one at a time and the variance of the selected process parameter is temporarily reset to zero. The noisy set of simulations is re-run and the new total variance is calculated and stored while still retaining the variance value of an original first run where none of the relevant variances were reset to zero.

Incremental leveraging has the advantage that it is good at suggesting one solution for input tolerance design. It does not, however, provide a mechanism for flexibility in allowing more than the one solution it provides for changing the tolerance constraints of the factors in the process under consideration.

In co-pending application Ser. No. 09/130,528, entitled Statistically Based Process Windows, inventor William D. Heavlin, assigned to the assignee of the present application, incremental leveraging methodology is utilized as a basis to define a statistically-based, process window algorithm wherein the response variability of a process is represented as a function of the tolerances of each variable. In brief, one utilizes the tolerance variations defined in the aforementioned algorithms as inputs to determine, for any number of process variables, the effect of varying the tolerance of each factor on the tolerances of other factors under consideration relative to a response factor for the entire process. This algorithm may be performed in a computer and have an output provided to a process engineer who may then determine optimal modifications to the nominal process under consideration to derive a toleranced process.

In general, the method defined in co-pending application Ser. No. 09/130,528 comprises: defining a nominal process; evaluating F input factors $\{X_f; f=1, \ldots, F\}$ which affect the output of the nominal process; and defining, as a result of the evaluation, a toleranced process having an output response less susceptible to variance in the input factors. The evaluation is performed by representing the variability of the response of the process as a function of the factors' current variability and selected tightening factors; performing an evaluation where the tightening factors are varied using an orthogonal array, varying the factors over $[0,1]^F$; and modeling, using kriging interpolation, a neural network or equivalents, to determine moments or other statistics of a distribution of the process for given changes in the constraints of each factor.

The method of forming the semiconductor device in accordance with the present invention results in better planning of next-generation equipment requirements and ultimately in improved product yields as the considered factors are improved upon.

SUMMARY OF THE INVENTION

An objective of the invention is to allow process engineers to determine, on a lot-by-lot basis, whether and how to make improvements in the processing of the particular lot under consideration.

A further objective of the present invention is to provide an evaluation method for process engineers to make qualitative judgements about the manufacturability of certain processes based on models of the output given a variety of inputs to the process.

Yet another object of the present invention is to improve yields in multi-faceted manufacturing processes, and particularly semiconductor manufacturing applications.

In one aspect, the invention, roughly described, comprises a method of fabricating a multi-component semiconductor device assembly, comprising: defining a nominal semiconductor manufacturing process having a plurality of process steps, the nominal process including a number of process input factors $X_1$–$X_F$ which, when perfectly controlled to meet the nominal process settings for such factors, produce a device assembly with defined operating characteristics; performing at least one of said plurality of process steps on at least one lot of wafers; and evaluating the process by: (1) representing the variability of the response of the operating characteristic as a function of the actual variability of at least one of said factors and at least one tightening factor; (2) evaluating said input factors subject to a variety of tightening factors array over $[0,1]^F$; and (3) modeling the output using an interpolation function to determine suitable tolerance models impacting control of one or more of said input factors.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

In manufacturing processes, such as those utilized for manufacturing a semiconductor device, imperfect control of input variables propagates through the manufacturing process to induce variation in the manufactured device, and in response variables describing the device. Where there are a number of process inputs, one can define the relative importance of such inputs, and more than one set of input tolerances which will meet the desired response. This means that there are trade-offs in the control tolerances, or required distributions of standard deviations, among the various input factors. While process windows represent one-to-one trade-offs, a more generalized model is required to consider all sets of input tolerances. The instant application presents a novel tolerance design method for manufacturing semiconductor devices.

While the method of the present invention will be described herein with respect to a semiconductor manufacturing process, it should be recognized that the method of the present invention may be applied to any process wherein a number of process variables affect the output variance of the manufactured product.

Figure 1:
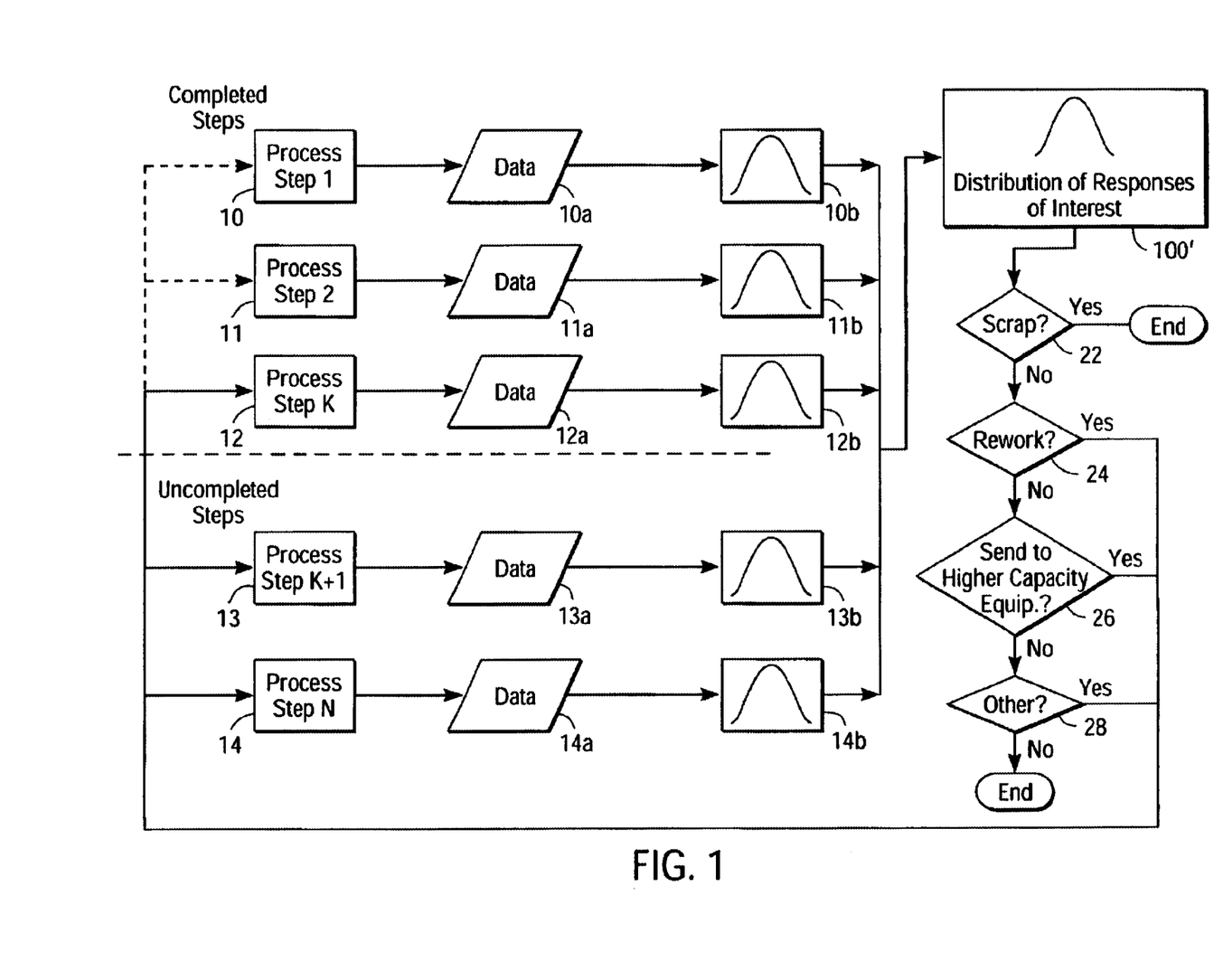
FIG. 1 is a flow diagram illustrating one embodiment of the method of the present invention.
Figure 2:
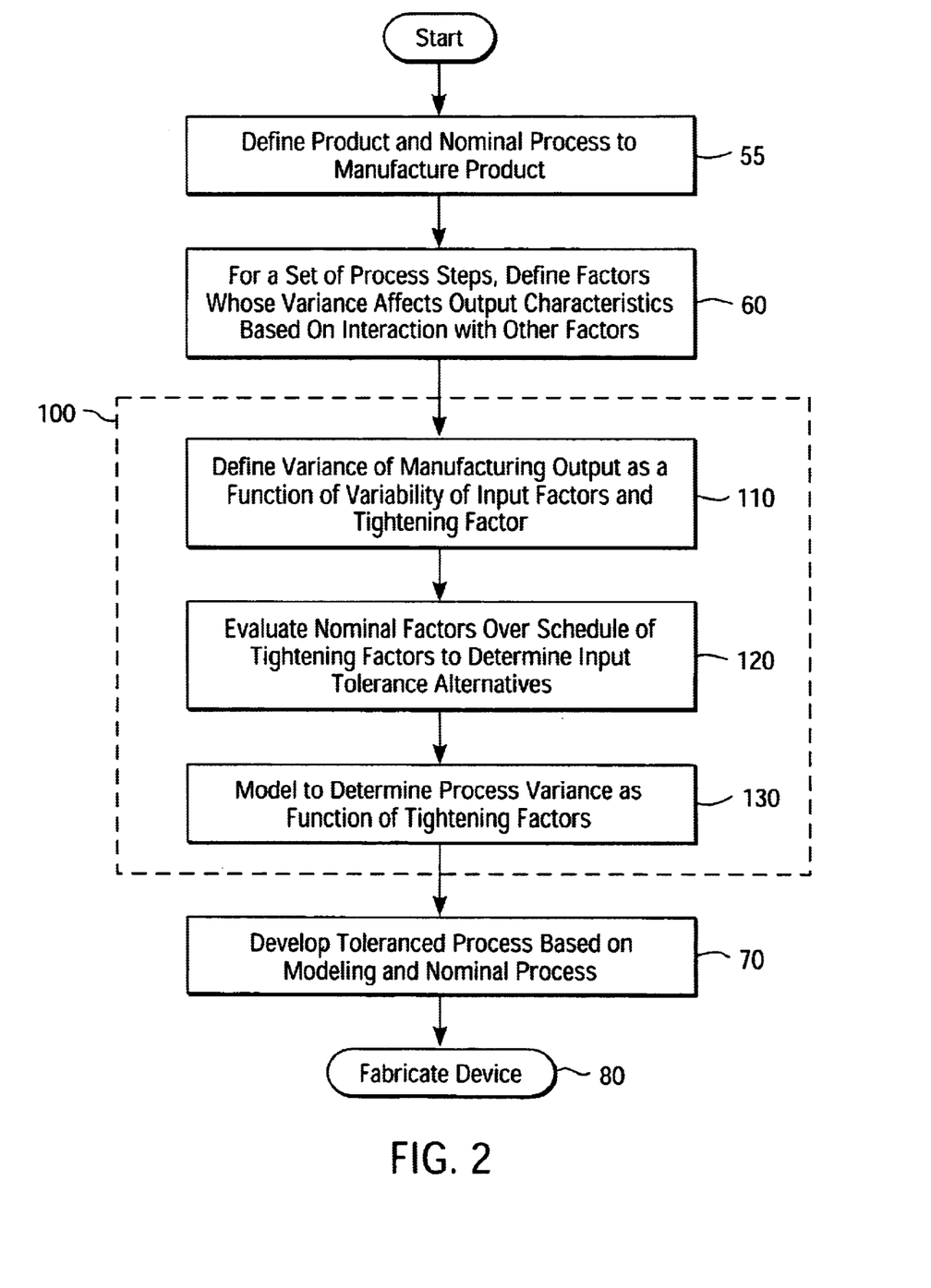
FIG. 2 is a flowchart illustrating the evaluation portion of the present invention.

FIG. 1 illustrates the method of the present invention. FIG. 2 is a block diagram representing the basic statistical process window methodology as utilized in the present application.

FIG. 1 shows a series of process steps 10–14 which are performed to manufacture a typical semiconductor device. By way of example, a typical semiconductor mass-production line which is part of an overall wafer processing system may include: (1) a station for coating each wafer with material layers such as the anti-reflective coating and photoresist layers; (2) a station for exposing the material layers (the photoresist layer) to a radiation pattern; (3) a station for developing each exposed wafer; and (4) a station for etching each developed wafer. The method of the present invention allows tweaking of the process at any one or multiples of such stations. Steps 10–14 represent individual steps at any one of such stations.

Typically, each post-etch wafer lot is moved further downstream for further processing (e.g., dopant implant) in accordance with well-known techniques. Before such further processing, sample wafers from each post-etch wafer lot may be sampled to determine critical dimensions in order to calibrate the computer model of the method of the present invention. As shown in FIG. 1, step 100 represents the statistical process window evaluation used over a set of F individual factors over N steps. For each component, the simulation is used to generate a statistical distribution of each fit-determining parameter. The distributions have a mean and a deviation about the mean, and also between manufacturing-capability-defined lower and upper limits, e.g., mean ±3 standard deviations.

In accordance with the invention, at some point in the series of steps 10–14 performed on a lot of wafers, an analysis of the lot-specific factors is performed and a decision regarding the wafers in the lot can be made resulting in either a savings with respect to further processing or a reworking of the lot prior to continued processing, to correct the problematic factor, and improve the resulting yield of the lot. This contrasts with previous statistical analysis wherein the entire process the lot was to be subjected to might be analyzed prior to processing. As shown in FIG. 1, each process step 10–14 results in a given set of data 10a–14a which has a given standard deviation 10b–14b for the lot. As such, the practical application of the statistical analysis of the performance factors allows for decisions to be made in real time in the processing of a given lot of wafers.

In FIG. 1, three processing steps are completed on a given lot when analysis in accordance with the present invention occurs. However, it should be recognized that the analysis of given data may be performed after any number of process steps 1–N where N is the last step in the process. This further differs from the statistical analysis of co-pending application Ser. No. 09/130,528 in that it substitutes lot-specific inputs for computed inputs to adapt the analysis to the particular lot.

The evaluation step 100 of the present invention may be performed in an independent computer unit or can be a module within a computer that also carries out functions of other described or to-be-described modules. The output of the model may be used by the process engineer in possession of other data, such as cost factors, to define constraints and make choices for altering the semiconductor manufacturing process to determine which constraints to confine or relax.

Following the evaluation step 100, the decisions to scrap 22, rework the lot 24, send the lot to higher capacity equipment 26 or take some other action 28, can be made based on lot-specific data to result in an overall improved yield for the lot.

FIG. 2 is a flowchart depicting, in one aspect, the evaluation method in accordance with the present invention. At step 55, a manufacturing process under consideration is defined based on the particular characteristics of the product to be manufactured. In the case of a semiconductor device, this process will include a number of process steps as described herein. The process defined to produce the product is generally referred to as the "nominal" process and results in process steps, each process step having one or more input factors, such as those factors set forth above with respect to the semiconductor manufacturing process.

As shown at step 60, for a set of process steps, the input factors whose variance affects the output yield of the process, based on their interaction with other factors, are defined. Each input factor will have a nominal or mean value, and a standard deviation about the mean value. The standard deviation can be an actual deviation during the process or a simulated deviation for purposes of the evaluation of the present invention.

Step 100, defined in dashed lines and comprising several sub-steps, comprises the evaluation portion of the method of the present invention. The evaluation portion 100 can comprise a set of instructions which are processed by a computer, in one or more modules as described above, designed specifically to implement the evaluation based on the input factors provided to it.

In one embodiment, as depicted in FIG. 2, the evaluation portion 100 of the method of the present invention comprises, at step 110, defining the variance of the manufacturing output—the product produced—as a function of the variability of the input factors and tightening factors applied to each input factor. Once so defined, at step 120, an evaluation is performed by varying the tightening factors to determine alternative input tolerances which yield acceptable manufacturing outputs. Finally, at step 130, the evaluation is modeled to determine the process variance as a function of the tightening factors. Following this evaluation, a determination as to the fate of the lot can be made with an intelligent projection of the performance of the lot.

Figure 3B:
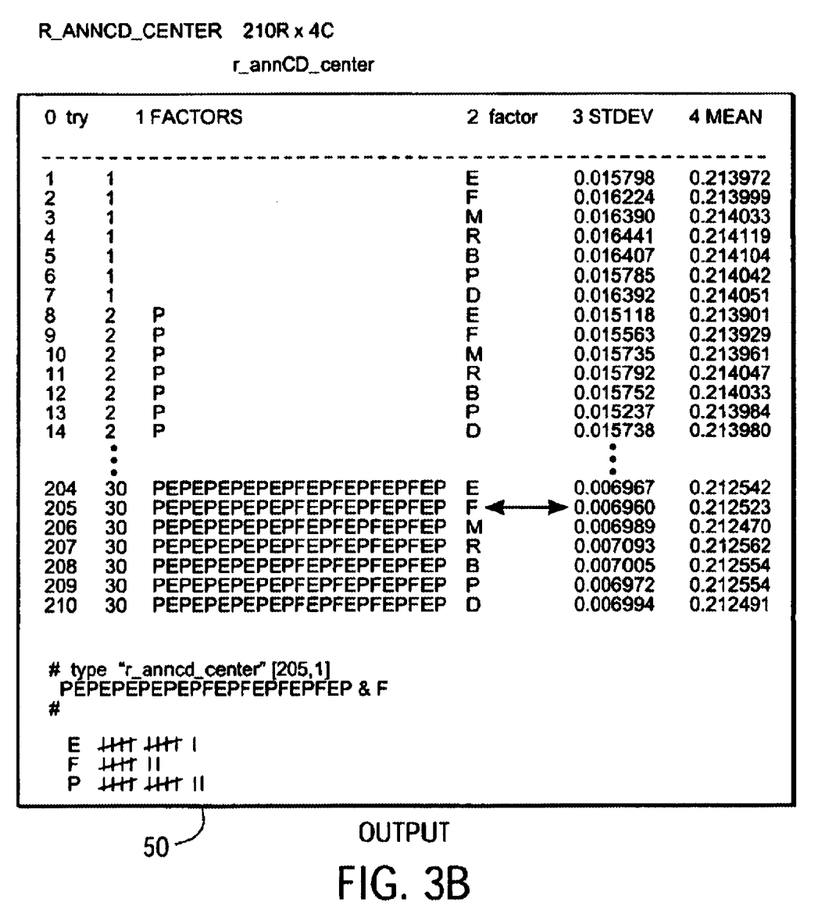

FIGS. 3A and 3B illustrate the output of the incremental leveraging calculation for a given simulation. This output of the incremental leveraging algorithm provides the tightening factor starting points for determining the matrix of tightening factors used in the evaluation portion of the present invention. The input table 40 includes the nominal mean and the standard deviation values for seven input factors considered in this example which comprises line width definition process, similar to that described above and in U.S. Pat. No. 5,646,870. Each factor is assigned an effort of 0.9, reflecting that, for this exercise, the design goal is a 10% incremental change. It should be recognized that other effort factors may be utilized in accordance with the present invention. The factor of a 10% increment is selected based upon common practice in the industry. The output table 50 shown in FIG. 6B comprises a calculation in accordance with the incremental leveraging algorithm described with respect to FIGS. 5A–5B, over 210 increments. Column 1 of output table 50 shows the resulting weighting of weighted tolerance factor for each of the seven factors analyzed. For example, for incremental row 205, the focus factor has a standard deviation of 0.06960, and the factors of exposure (ExpD), focus and post exposure bake (PEB) are shown to have the greatest contribution over these increments. Incremental leveraging assigns the focus parameter 7 increments, exposure 11 increments, and PEB 12 increments. This yields tightening factors for ExpD of $0.31381=(0.9)^{11}$, for Focus of $0.47830=(0.9)^{7}$, and for PEB of $0.28243=(0.9)^{12}$.

Figure 4:
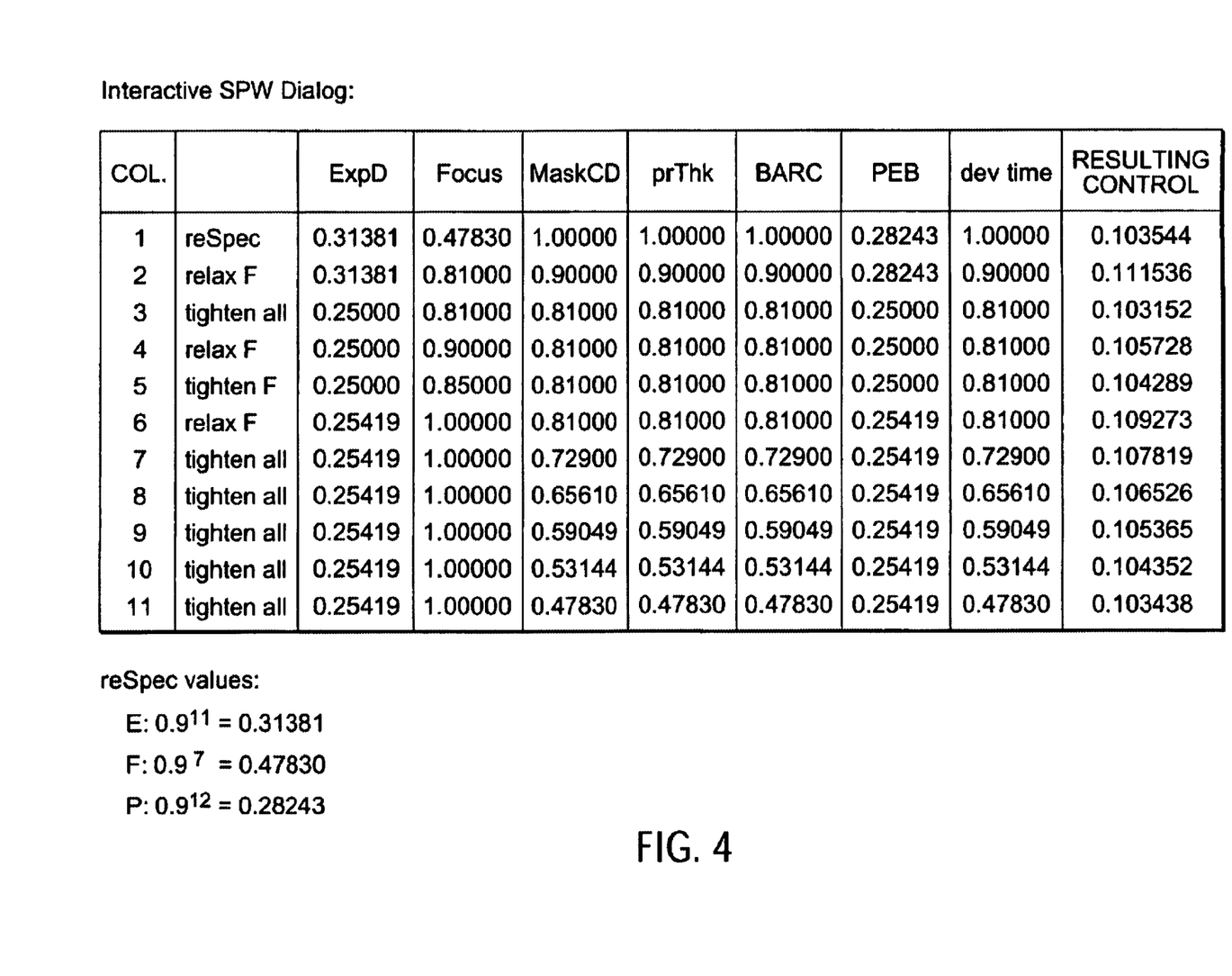
FIG. 4 is an interactive dialog table illustrating a portion of the method of the present invention.
Figure 5:
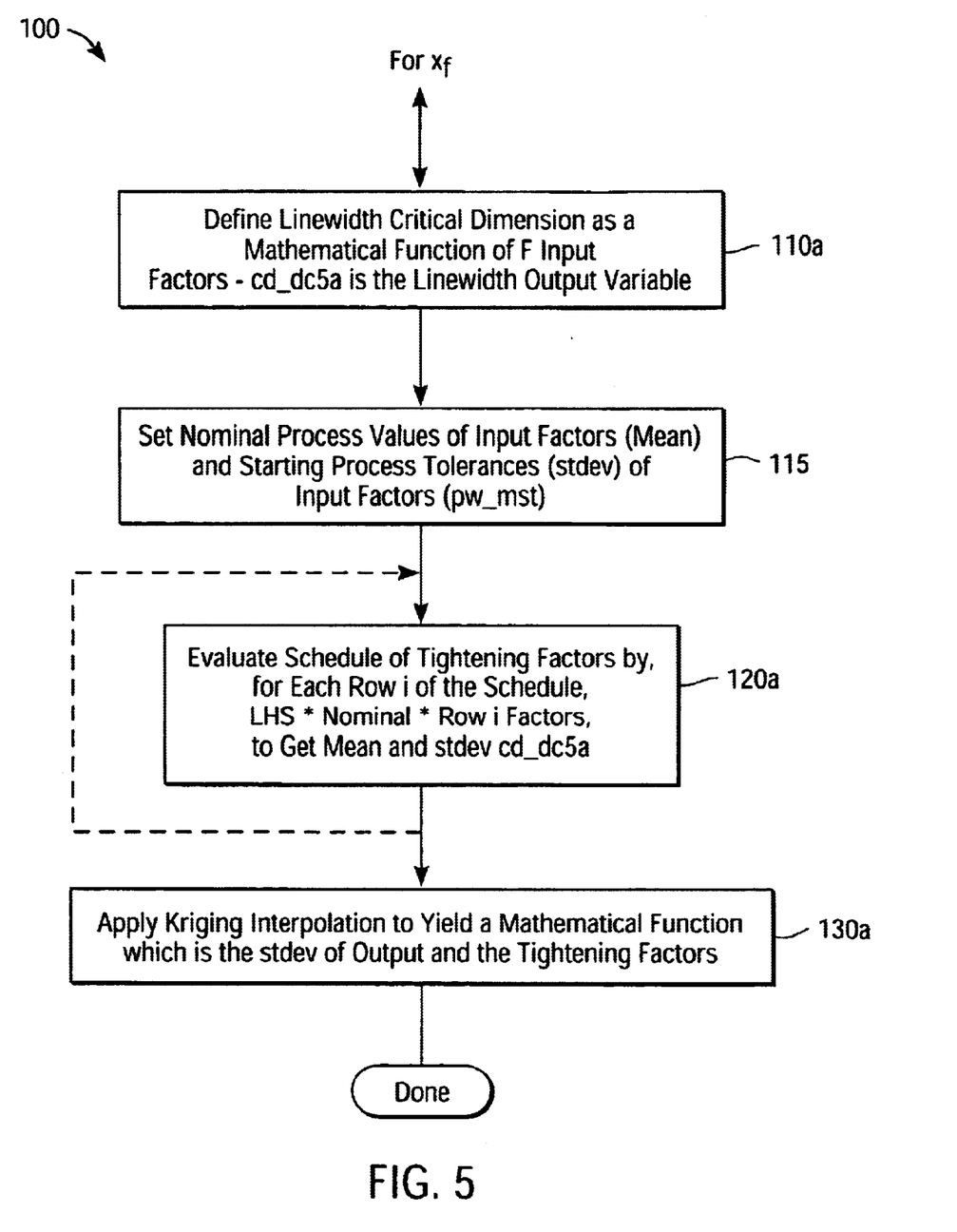
FIG. 5 is a flow chart illustrating the statistical process window evaluation portion of the method of the present invention.

FIG. 4 shows an interactive dialog for a statistical process window algorithm that is used in the evaluation portion of the present invention. FIG. 5 presents a generalized description of the evaluation algorithm of the present invention which should aid in understanding the more specific description to follow. In general, the dialog depicts the interaction between terms necessary to loosen the tightening factor for focus from an interactive leveraging-derived value to 1.0, and the effect on the tightening factors of all other factors under evaluation. It should be noted that while focus is illustrated as the factor under consideration, other factors, or multiple factors, may be considered.

The tightening factors for exposure, focus and post expose bake are calculated tightening factors based on an incremental leveraging algorithm, as described above. All other factors are assigned a factor of $1.0=(0.9)^{0}$. A resulting control factor is computed. The control factor reflects the $3\sigma$/mean value as computed in an incremental leveraging algorithm. Next, the tightening factor for focus is relaxed (from 0.47830 to 0.081 (at col. 2)), and all other factors except ExpD and PEB tightened, and the resulting control recalculated. As will be noted, the control factor increases to 0.11536. Next all factors, including ExpD and PEB are tightened, and the control factor again calculated. This process continues as illustrated in FIG. 4.

The goal of the aforementioned dialog can be seen by reviewing the subsequent rows 4–11 wherein the focus contribution is relaxed to zero increments $(0.9)^{0}=1.0$ in row 6, as all other factors are tightened until the resulting control factor achieves proximity with the initial, incrementally-derived control factor in row 1 of the dialog.

Comparing the statistical process window dialog with incremental leveraging, incremental leveraging gives an output for each factor of $(\sigma)_f(\lambda)^{k(f)}$, a non-negative integer, for each tolerance. With SPW, the resulting control allows one to relax or modify any number of the factors (not merely the single focus factor identified in the dialog of FIG. 4), to achieve the resulting control value. It should be noted that in the method of the present invention, each of the process factors may be varied relative to external considerations, such as cost or ease of control over the factor. In the aforementioned example of FIG. 4, the noise factor is selected at (0.9). In one aspect of the method of the present invention, the noise factor is varied over $[0,1]^{F}$ (mathematically, the interval from 0 to 1, inclusive) in an orthogonal array by means of a computer simulation as described below. In an alternative aspect, the noise factor may be varied over $[0,C]^{F}$, where $C \geqq 1$, to incorporate both tightening and loosening factors into the evaluation.

Figure 6:
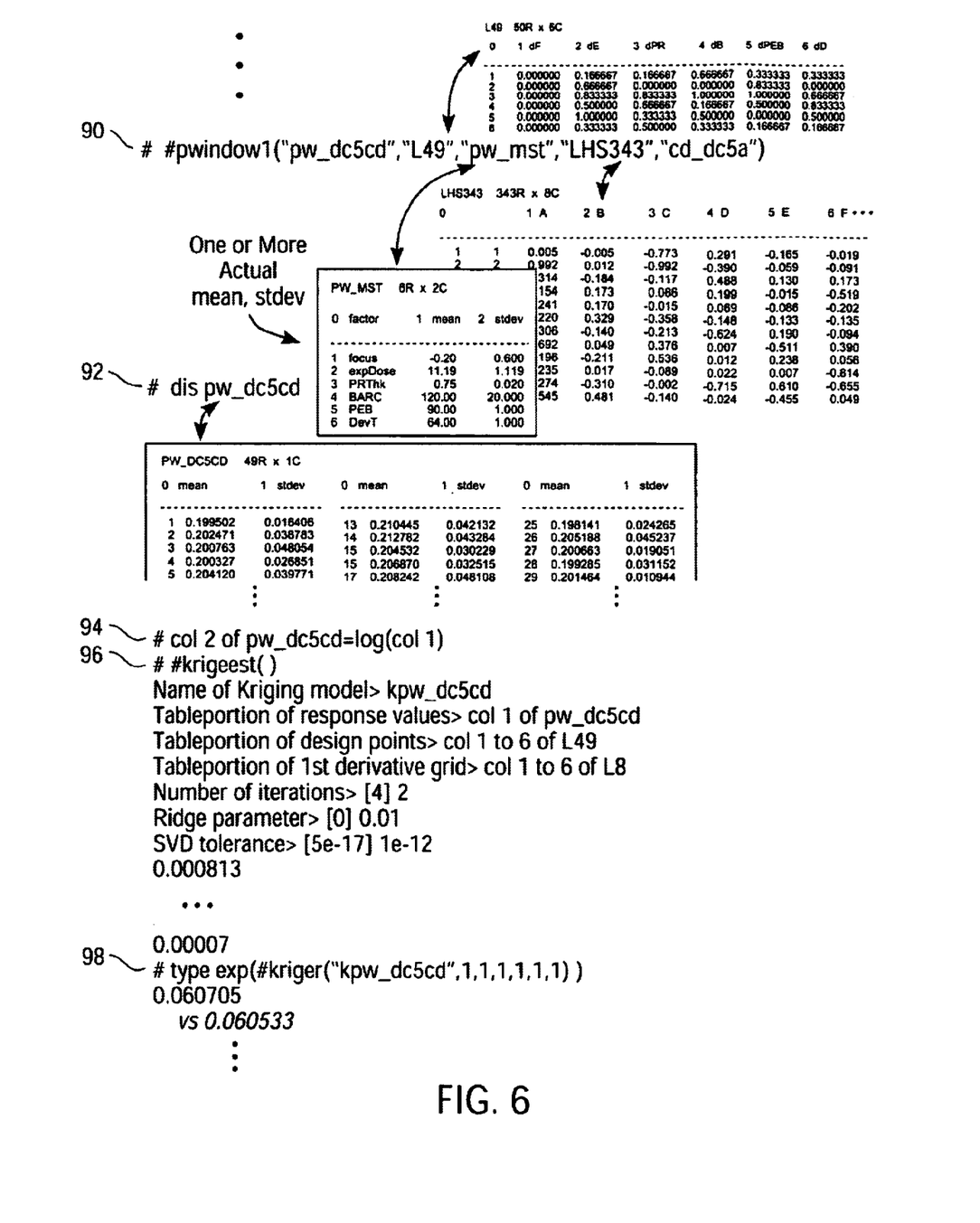
FIG. 6 is a graphical representation of the command instructions and matrix input for the method set forth in FIG. 5.

The evaluation portion 100 of the method of the present invention will be described with reference to FIGS. 5 and 6. FIG. 5 is a flow chart of the evaluation algorithm 100 of the present invention. FIG. 6 is a representation of the command instructions and mathematical inputs of the evaluation method of the present invention.

FIGS. 5 and 6 consider, for example, a lithography portion of a semiconductor manufacturing process. A nominal lithography process has been determined by process engineers, based on the device to be manufactured, and the nominal process will be evaluated in accordance with the inventive method.

As shown in FIG. 5, process step 110a consists of defining a resulting linewidth critical dimension as a mathematical function of a number (f) of input factors. The result is an output variable (cd_dc5a) which is the goal of the linewidth definition process (e.g., a linewidth). In one aspect of the present invention, this definition step 110a can be performed by a kriging interpolation in accordance with the approach outlined in B. D. Ripley, "Spatial Statistics," article 7 set forth above, or by suitable fast computer simulation techniques. Essentially, step 110a can be decomposed into the substeps of: building;a kriging model to determine the response dimension relative to the input factors; and calibrating the model. The calibration adjustment may be performed in accordance with the teachings of W. D. Heavlin and L. Capodieci in "Calibration and Computer Experiments," cited as article 15, above, wherein simulated critical dimensions are compared against empirical critical dimensions. The calibration model may result from either kriging interpolation or use of a neural network in accordance with the teachings of the aforementioned reference. The output critical dimension used in the method of the present invention (cd_dc5a) is the result of the calibration model and the simulation critical dimension resulting from the kriging model.

In FIG. 6, the evaluation steps 110a, 115 and 120 a are represented as a single command line 90 which may be used to call the functions or tables described herein. The tables and arrays described with respect to FIG. 5 are graphically represented. In FIG. 6, at step 115, the nominal process values of the input factors and the starting process tolerances are defined for input to the evaluation portion of the method. The input factors (mean) and variances (stdev) are set forth in a table (pw_mst). The nominal process targets at the input factors are the starting (wide-standard deviation, current generation) process tolerances of the input factors.

In accordance with the present invention, the input factors for the mean and variances for each factor may be real data 10a–14a, or calculated data in accordance with the foregoing description.

The current generation values of the input factors are then used to build a data set for the evaluation-portion of the method of the present invention.

At step 120a, a schedule of tightening factors (L49 as illustrated in FIG. 6) is then evaluated against the defined output variable (cd_dc5a), which is subjected to a Latin hypercube sampling (LHS343) for each row of the schedule of tightening factors in accordance with the following pseudocode:

```
loop "schedule" (L49)
    for row i of schedule
        copy LHS_i from LHS
        loopj
            Col j of LHS_i=mst(mean)(j)+(Col j of LHS_i)*
                mst(std)(j)*sched(i,j)
        end loop j
        LHS_i (343 rows) → cd_dc5a
        m(i) = mean of LHS_343 → cd_dc5a
        s(i) = stdev of LHS_343 → cd_dc5a
end loop i
```

Step 128 results in an output (pw_dc5cd as represented in FIG. 6), which is a mean and standard deviation table with a number of rows (49) corresponding to the number of rows (49) in the schedule (L49) of tightening factors. The output pw_dc5cd is then used in a kriging interpolation at step 130a, to yield a mathematical function which is the standard deviation of the output response and the tightening factors.

The output of the kriging interpolation shall be referred to herein as the "statistical process windows (SPW) function." The SPW function is the standard deviation of the output response as a function of each input factor and a corresponding tightening factor for the particular input factor.

As represented in FIG. 6, at step 94, the log of col. 1 (stdev) of pw_dc5cd is taken to exaggerate small values of the output variance. As shown in FIG. 6, in the particular kriging estimation which is utilized in the present invention—kpw_dc5cd, two iterations are used with a ridge (a.k.a. nugget) parameter of 0.01.

At step 98 of FIG. 6, the exponent is taken in accordance with conventional statistical techniques to invert the log function of step 94.

As shown at step 98, the kriging interpolated estimate is a deviation of 0.060705, compared to a directly-calculated value of 0.060533 for one particular point of interest.

Once the evaluation portion of the present invention is completed for a particular step, the process evaluator can make any number of decisions as indicated in FIG. 1.

The many features and advantages of the present invention will be readily apparent to one of average skill in the art. The method of the present invention provides a model which can be used in processing devices based upon computer-simulated results of processes, or on empirically derived models of each process. No specification of a cost-of-tolerance function is required, thereby simplifying application of the method to various processes or sub-processes in device manufacturing.

The method of the present invention utilizes an evaluation process which makes explicit the trade-off in the control requirements amongst various manufacturing steps, and provides a quantitative analysis of this trade-off for use by process engineers in developing the fabrication process. Process engineers are provided with an explicit role for engineering judgment by the quantitative description of each trade-off in the process.

Obvious modifications to the method of the invention will be apparent to those of average skill in the art. For example and without limitation, at step 130a, other methods of modeling the output of step 120a, such as utilizing a neural network, are contemplated. All such modifications are intended to be within the scope of the invention as defined by the claims.

What is claimed is:

1. A method of fabricating a multi-component semiconductor device assembly, comprising:
   (A) defining a nominal semiconductor manufacturing process having a plurality of process steps, the nominal process including a number of process input factors $X_1$–$X_f$ which, when perfectly controlled to meet the nominal process settings for such factors, produce a device assembly with defined operating characteristics, the input factors each having a distribution of acceptable tolerances which are acceptable inputs to the process which result in the defined operating characteristics;
   (B) performing at least one of said plurality of process steps on at least one lot of wafers;
   (C) evaluating the process by:
      (1) representing the distribution of the response of the operating characteristic as a function of the actual distribution of at least one of said factors and parameterized by at least one parameter;
      (2) evaluating said input factors subject to a variety of tightening or loosening factors in an array over $[0,C]^F$, where $C \geq 1$;
      (3) modeling an output using an interpolation function to determine suitable tolerance models impacting control of one or more of said input factors.

2. The method of claim 1 wherein said step C(3) comprises evaluating said factors in an array over $[0,1]^F$.

3. The method of claim 1 wherein said step C(3) comprises evaluating said input factors in an array over $[0, C]^F$ where $C \geq 1$.

4. The method of claim 1 wherein said step (B)(1) comprises the sub-steps of:
   defining an output response based on a matrix of said factors; and
   calibrating said output response based on empirical data of the output response.

5. The method of claim 4 wherein said sub-step of defining comprises utilizing a kriging interpolation.

6. The method of claim 4 wherein said sub-step of defining comprises utilizing a neural network.

7. The method of claim 1 wherein said step (B)(2) comprises:
   for a schedule of tightening factors, evaluating for each row of the schedule, a Latin hypercube sample of, for each column of the sample, at least the mean and standard deviation of each input factor, taking the mean of the Latin hypercube sample output of each row of the schedule in the standard deviation of the Latin hypercube sample for each row of the schedule.

8. The method of claim 1 wherein said step (B)(3) comprises applying a kriging interpolation to the output of said step (B)(2).

9. The method of claim 1 wherein said step (B)(3) comprises utilizing a neural network on the output of step (B)(2).

10. The method of claim 1 wherein steps (B)(2) and (B)(3) are repeated based on empirical choices made according to external factors of the nominal process.

11. The method of claim 1 wherein said step (B)(1) comprises:
    simulating an output response as a function of the input factors to determine an output variable; and
    calibrating the simulation by comparing empirically determined output responses as a function of selected factors to simulated output responses generated by the simulation.

12. The method of claim 11 wherein the step of simulating comprises using a kriging interpolation.

13. A method of fabricating a multi-component assembly, the method including at least components X1–Xf wherein each of said components X1–Xf has a distribution of acceptable tolerances within which the method will produce the multi-component assembly in an acceptable fashion, comprising:
    (A) defining nominal values of each component;
    (B) performing at least one of a series of steps on a lot of wafers to determine a real variance of at least one of said components;
    (C) evaluating the performance of the method on the lot by:
        (1) defining the distribution of at least one critical dimension of the assembly as a function of said actual distribution of at least one of the components and parameterized by at least one parameter, at least one parameter associated with each component;
        (2) analyzing the nominal components by comparing a Latin hypercube sampling of the nominal components against a schedule of parameters;
        (3) modeling the analyzed components to define the variance of an output as a function of the components and the parameters; and
    (D) manufacturing the multi-component assembly by performing the method and controlling ones of said components based on the output of step (B).

14. The method of claim 13 wherein said step (C)(1) comprises the sub-steps of:
    defining an output response based on a matrix of said factors; and
    calibrating said output response based on empirical data of the output response.

15. The method of claim 14 wherein said sub-step of defining comprises utilizing a kriging interpolation.

16. The method of claim 14 wherein said sub-step of defining comprises utilizing a neural network.

17. The method of claim 13 wherein said step (C)(2) comprises:
    for a schedule of parameters, evaluating for each row of the schedule, a Latin hypercube sample of, for each column of the sample, the mean and standard deviation of each input factor, taking the mean of the Latin hypercube sample output of each row of the schedule in the standard deviation of the Latin hypercube sample for each row of the schedule.

18. The method of claim 13 wherein said step (C)(3) comprises applying a kriging interpolation to the output of said step (C)(2).

19. The method of claim 13 wherein said step (C)(3) comprises utilizing a neural network on the output of step (C)(2).

20. The method of claim 13 wherein steps (C)(2) and (C)(3) are repeated based on empirical choices made according to external factors.

21. The method of claim 13 wherein said step (C)(1) comprises:
    simulating an output response as a function of the input factors to determine an output variable; and
    calibrating the simulation by comparing empirically determined output responses as a function of selected factors to simulated output responses generated by the simulation.

22. The method of claim 21 wherein the step of simulating comprises using a kriging interpolation.

23. A method of evaluating a lot of wafers being processed during a series of steps in a nominal manufacturing process having a plurality of components, each component having a mean and standard deviation; comprising the steps of:
    (A) performing at least one of said series of steps in said manufacturing process to determine an actual current variability for a factor;
    (B) representing the variability of a response of a system to the current variability of at least one of said factors and at least one tightening factor;
    (C) evaluating said components against a schedule of tightening factors in an orthogonal array;
    (D) modeling an output of the evaluation using interpolation to determine a mathematical function defining a toleranced process; and
    (E) applying at least one of the models to a fabrication system to complete the model.

24. The method of claim 23 wherein said step (A) comprises:
    defining an output response based on a matrix of said factors; and
    calibrating said output response based on empirical data of the output response.

25. The method of claim 24 wherein said step of defining comprises utilizing a kriging interpolation.

26. The method of claim 24 wherein said step of defining comprises utilizing a neural network.

27. The method of claim 23 wherein said step (B) comprises:
    for a schedule of tightening factors, evaluating for each row of the schedule, a Latin hypercube sample of, for each column of the sample, the mean and standard deviation of each input factor, taking the mean of the Latin hypercube sample output of each row of the schedule in the standard deviation of the Latin hypercube sample for each row of the schedule.

28. The method of claim 23 wherein said step (C) comprises applying a kriging interpolation to the output of said step (B).

29. The method of claim 23 wherein said step (C) comprises utilizing a neural network on the output of step (B).

30. The method of claim 23 wherein steps (B) and (C) are repeated based on empirical choices made by external factors.

31. The method of claim 23 wherein said step (A) comprises:
    simulating an output response as a function of the input factors to determine an output variable; and
    calibrating the simulation by comparing empirically determined output responses as a function of selected factors to simulated output responses generated by the simulation.

32. A computer program embodied in a non-volatile memory, responsive to inputs, comprising:
  (A) means for defining an output factor based on the variance of the inputs;
  (B) means for evaluating input factors by computing:
    for each row i of a schedule of input factors,
    for each column in a Latin hypercube sampling $$\text{Col } j \text{ of } LHS_i = \text{mst(mean)}(j) + (\text{Col } j \text{ of } LHS_i)*\text{mst(std)}(j)*\text{sched}(i,j)$$

end loop j, to compute
    m(i)=mean of LHS rows
    s(i)=stdev of LHS rows; and
  (C) modeling the tolerance of the input factors by kriging interpolation to yield an output variance which is a function of the inputs.

* * * * *